United States Patent
Lu et al.

(10) Patent No.: US 11,655,871 B2
(45) Date of Patent: May 23, 2023

(54) COMPOSITES AND METHODS OF FORMING COMPOSITES VIA PITCH INFILTRATION

(71) Applicant: GOODRICH CORPORATION, Charlotte, NC (US)

(72) Inventors: Weiming Lu, Akron, OH (US); Gary Pruett, Boradview Heights, OH (US)

(73) Assignee: Goodrich Corporation, Charlotte, NC (US)

( * ) Notice: Subject to any disclaimer, the term of this patent is extended or adjusted under 35 U.S.C. 154(b) by 497 days.

(21) Appl. No.: 16/818,930

(22) Filed: Mar. 13, 2020

(65) Prior Publication Data
US 2021/0285511 A1  Sep. 16, 2021

(51) Int. Cl.
*F16D 69/02* (2006.01)
*F16D 65/12* (2006.01)
*C23C 16/26* (2006.01)

(52) U.S. Cl.
CPC ......... *F16D 69/023* (2013.01); *F16D 65/126* (2013.01); *C23C 16/26* (2013.01); *F16D 2200/0052* (2013.01); *F16D 2200/0065* (2013.01); *F16D 2200/0091* (2013.01)

(58) Field of Classification Search
CPC ...... F16D 69/023; F16D 65/126; C23C 16/26
See application file for complete search history.

(56) References Cited

U.S. PATENT DOCUMENTS

| | | | |
|---|---|---|---|
| 4,986,943 A | | 1/1991 | Sheaffer et al. |
| 5,733,484 A | * | 3/1998 | Uchida ................ D01F 9/145 264/29.7 |
| 6,221,475 B1 | * | 4/2001 | Domergue ............ C04B 41/009 523/156 |
| 6,537,470 B1 | | 3/2003 | Wood et al. |
| 8,268,207 B2 | * | 9/2012 | La Forest ............. F16D 69/023 264/103 |
| 9,428,388 B2 | | 8/2016 | Lakrout et al. |
| 10,370,302 B2 | * | 8/2019 | La Forest ............ B23K 26/364 |
| 10,443,124 B1 | | 10/2019 | Purdy et al. |

(Continued)

FOREIGN PATENT DOCUMENTS

| | | |
|---|---|---|
| EP | 2309147 | 4/2011 |
| EP | 2322818 | 5/2011 |

(Continued)

OTHER PUBLICATIONS

European Patent Office, European Search Report dated Dec. 15, 2021 in Application No. 21161681.8.

(Continued)

*Primary Examiner* — Vishal R Sahni
(74) *Attorney, Agent, or Firm* — Snell & Wilmer L.L.P.

(57) ABSTRACT

A method of pitch infiltration of a densified preform may comprise disposing a pitch on a densified preform surface; heating the pitch and making the pitch into an anisotropic network structure; guiding the pitch through the densified preform in a predetermined direction; aligning the pitch in a predetermined orientation; and stabilizing the pitch. The method may result in a carbon/carbon part having increase wear life, enhanced oxidation protection, and/or reduced moisture sensitivity.

14 Claims, 5 Drawing Sheets

(56) References Cited

U.S. PATENT DOCUMENTS

| | | | |
|---|---|---|---|
| 2004/0192534 A1* | 9/2004 | Nixon | C04B 35/80 501/95.2 |
| 2008/0025906 A1* | 1/2008 | Lin | B82Y 30/00 423/445 B |
| 2008/0176067 A1* | 7/2008 | Kienzle | C23C 16/26 427/249.4 |
| 2010/0018815 A1 | 1/2010 | Murdie | |
| 2011/0083305 A1* | 4/2011 | La Forest | F16D 69/023 28/112 |
| 2011/0111123 A1* | 5/2011 | La Forest | F16D 69/023 427/249.4 |
| 2015/0031522 A1* | 1/2015 | La Forest | C04B 35/521 501/1 |
| 2015/0115195 A1* | 4/2015 | Lakrout | C08G 59/687 252/71 |
| 2015/0128828 A1 | 5/2015 | La Forest et al. | |
| 2016/0060115 A1* | 3/2016 | La Forest | C04B 35/62886 423/445 R |
| 2017/0362753 A1* | 12/2017 | Le Costaouec | C23C 16/045 |
| 2018/0111882 A1* | 4/2018 | Rateick, Jr. | C04B 37/001 |
| 2019/0092698 A1* | 3/2019 | Kirkpatrick | F16D 69/023 |

FOREIGN PATENT DOCUMENTS

| | | |
|---|---|---|
| EP | 2687503 | 1/2014 |
| EP | 2993162 | 3/2016 |
| EP | 3109221 | 12/2016 |

OTHER PUBLICATIONS

European Patent Office, European Partial Search Report dated Jul. 30, 2021 in Application No. 21161681.8.

* cited by examiner

COMPOSITES AND METHODS OF FORMING COMPOSITES VIA PITCH INFILTRATION

FIELD

The present disclosure relates to carbon composite material, and more specifically, to a system and method for manufacturing a C/C brake disk.

BACKGROUND

Aircraft brake systems typically employ a series of brake disks that, when forced into contact with each other, help stop the aircraft. The brake disks may comprise a carbon fiber-reinforced/carbon matrix (C/C) composite material. For example, in a brake system, the rotor friction disks, stator friction disks, pressure plates, and/or end plates may be comprised of C/C composite materials. Typical C/C composite materials may include open porosity and poor fiber/matrix interface. The open porosity and fiber/matrix interfaces may result in high wear rate and/or high moisture sensitivity.

SUMMARY

A method of pitch infiltration of a densified preform is disclosed herein. The method may comprise: disposing a pitch on a densified preform surface, wherein the pitch is a mesophase pitch; heating the pitch and making the pitch into an anisotropic network structure; guiding the pitch through the densified preform in a predetermined direction; managing a crystal size of the pitch; aligning the pitch in a predetermined orientation; and stabilizing the pitch into a pitch-based carbon of a composite; and carbonizing the composite and further managing the crystal size of the pitch-based carbon in the composite.

In various embodiments, the method may further comprise heating the pitch includes heating the pitch between 200° F. (93° C.) and 700° F. (371° C.). The method may further comprise at least partially filling an open pore of the densified preform with the pitch for blocking an oxidation protection system (OPS) migration pathway. In various embodiments, managing the crystal size may further comprise monitoring the crystal size and reducing a composite heat treatment temperature in response to the crystal size reaching a predetermined crystal size. The densified preform surface may be at least one of an outer diameter surface, an inner diameter surface, and an axial surface to cover the active sites located at fiber and matrix interfaces. Stabilizing the pitch may further comprise exposing the pitch and the densified preform to at least one of air and nitrogen at a fixed temperature between 150° F. (66° C.) and 700° F. (220° C.) for at least one of oxidative stabilization and thermal stabilization. The method may further comprise heating the densified preform and the pitch after stabilizing the pitch by exposing the pitch and the densified preform to at least one of air and nitrogen at a fixed temperature between 150° F. (66° C.) and 700° F. (220° C.).

A method of manufacturing a carbon/carbon brake disk is disclosed herein. The method may comprise: forming a fibrous network from an oxidized carbon fiber precursor; carbonizing the oxidized carbon fiber precursor by heating the oxidized carbon fiber precursor at 1400-2800° C. to form a carbon fiber preform; infiltrating the carbon fiber preform with carbon using chemical vapor infiltration or deposition (CVI/CVD) processing to increase a density of the carbon fiber preform to form a densified preform; infiltrating the densified preform with pitch by heating the pitch and making it into a anisotropic network structure and guiding the pitch through an open porosity of the densified preform in a predetermined direction; managing a crystal size of the pitch; stabilizing the pitch; and carbonizing the densified preform with stabilized pitch after stabilizing.

In various embodiments, the method may further comprise aligning the pitch in a predetermined orientation within the open porosity. The method may further comprise at least partially filling the open pores with the pitch for blocking an oxidation protection system (OPS) migration pathway. Managing the crystal size may further comprise monitoring the crystal size and reducing a temperature in response to the crystal size reaching a predetermined crystal size. The method may further comprise at least partially filling the open porosity with the pitch for blocking an oxidation protection system (OPS) migration pathway. Stabilizing the pitch may further comprise exposing the pitch and the densified preform to at least one of air and nitrogen at a fixed temperature between 150° F. (66° C.) and 700° F. (220° C.) for at least one of oxidative stabilization and thermal stabilization. Heating the densified preform and the pitch further comprises exposing the pitch and the densified preform to at least one of air and nitrogen at a fixed temperature between 150° F. (66° C.) and 700° F. (371° C.).

A carbon/carbon (C/C) part is disclosed herein. The C/C part may comprise: carbon fiber accounting for between 15% and 40% of volume; chemical vapor infiltration or deposition (CVI/CVD) carbon fiber accounting for between 15% and 35% of a volume of the C/C part; a pitch accounting for between 3% and 35% of the volume of the C/C part.

In various embodiments, an open porosity of the C/C part is less than 10%. The pitch may infiltrated in a densified preform, the densified preform including the carbon fiber and the carbon matrix. The pitch may be guided in a desired orientation during a pitch infiltration process. A crystal size of the pitch may be managed by monitoring the crystal size and reducing a temperature in response to the crystal size reaching a predetermined crystal size. The pitch may be oriented in at least one of an axial and a radial direction.

The foregoing features and elements may be combined in various combinations without exclusivity, unless expressly indicated herein otherwise. These features and elements as well as the operation of the disclosed embodiments will become more apparent in light of the following description and accompanying drawings.

Figure 1A:
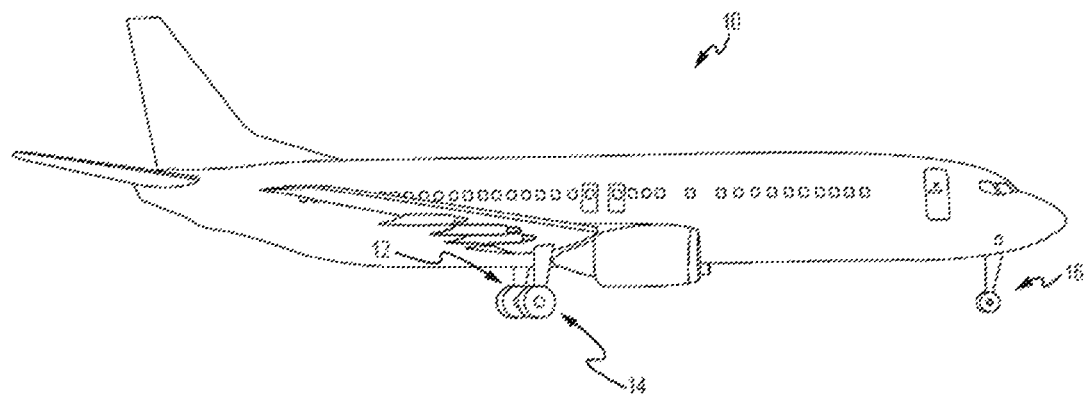
FIG. 1A illustrates an exemplary aircraft having a brake system, in accordance with various embodiments.

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not of limitation.

Provided herein, according to various embodiments, are fiber reinforced composite parts and method(s) for fabricating fiber reinforced composite parts, such as brake disks, having one or more wear plugs located therein. While numerous details are included herein pertaining to aircraft components, such as brake components, the manufacturing system(s) and method(s) disclosed herein can be applied to fabricate other ceramic matrix composite components.

In various embodiments, crystal orientation (CO) of carbon fiber (otherwise referred to as Carbon Fiber Crystal Orientation, CFCO) affects friction performance of friction disks. In particular, it has been determined that an increase in CFCO results in an increased friction performance. Thus, it is desirable to create friction disks for use with disk brakes that include a carbon fiber material having a CFCO that is relatively high, such as above 75 percent (75%), 80%, 85%, 90%, or the like. Crystal orientation may be defined as a percentage of fibers in a material that are aligned along a common axis. For example, if the CFCO is 80%, 80% of the carbon fibers may be aligned along a common axis.

Referring to FIG. 1A, in accordance with various embodiments, an aircraft 10 is illustrated. The aircraft 10 includes landing gear, which may include a left main landing gear 12, a right main landing gear 14, and a nose landing gear 16. The landing gear support the aircraft 10 when it is not flying, allowing the aircraft 10 to taxi, take off and land without damage. While the disclosure is directed generally to brake systems or mechanisms for aircraft, the principles disclosed herein may be equally applicable to brake systems or mechanisms used for other vehicles, such as, for example, those used on locomotives or cars for trains or on automobiles.

Figure 1B:
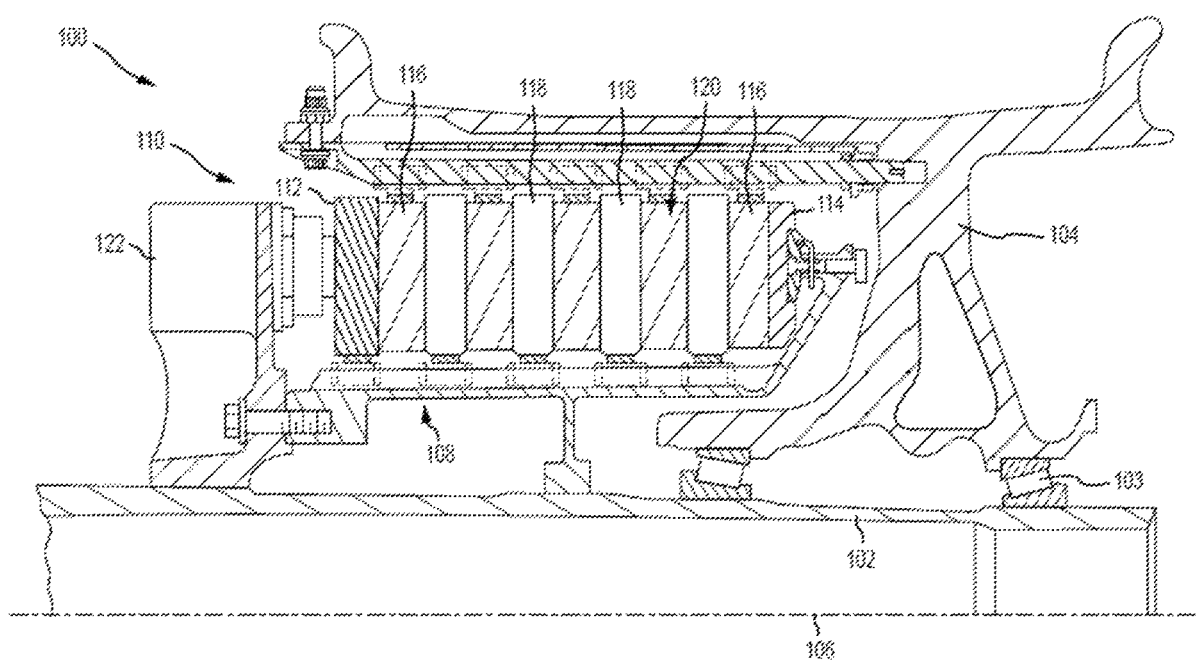
FIG. 1B illustrates a cross-sectional view of a brake assembly, in accordance with various embodiments.

Referring now to FIG. 1B, a brake assembly 100 is illustrated. Brake assembly 100 is configured for use on a landing gear, such as, for example, each of the left main landing gear 12 and the right main landing gear 14 described above with reference to FIG. 1A. In various embodiments, the brake assembly 100 is mounted on an axle 102 for use with a wheel 104 disposed on and configured to rotate about the axle 102 via one or more bearing assemblies 103. A central axis 106 extends through the axle 102 and defines a center of rotation of the wheel 104. A torque plate barrel 108 (sometimes referred to as a torque tube or barrel or a torque plate) is aligned concentrically with the central axis 106. The wheel 104 is rotatable relative to the torque plate barrel 108. As used herein, the term "axial" refers to directions parallel to central axis 106, the term "radial" refers to directions normal to central axis 106, and the "circumferential" refers to directions about central axis 106.

The brake assembly 100 includes a piston assembly 110, a pressure plate 112 disposed adjacent the piston assembly 110, an end plate 114 positioned a distal location from the piston assembly 110, and a plurality of rotor disks 116 interleaved with a plurality of stator disks 118 positioned intermediate the pressure plate 112 and the end plate 114. The pressure plate 112, the plurality of rotor disks 116, the plurality of stator disks 118, and the end plate 114 together form a brake heat sink or brake stack 120. The pressure plate 112, the end plate 114, and the plurality of stator disks 118 are mounted to the torque plate barrel 108 and remain rotationally stationary relative to the axle 102. The plurality of rotor disks 116 is mounted to the wheel 104 and rotate with respect to each of the pressure plate 112, the end plate 114, and the plurality of stator disks 118.

An actuating mechanism for the brake assembly 100 includes a plurality of piston assemblies, including the piston assembly 110, circumferentially spaced around a piston housing 122 (only one piston assembly is illustrated in FIG. 1B). Upon actuation, the plurality of piston assemblies affects a braking action by urging the pressure plate 112 and the plurality of stator disks 118 into frictional engagement with the plurality of rotor disks 116 and against the end plate 114. Through compression of the plurality of rotor disks 116 and the plurality of stator disks 118 between the pressure plate 112 and the end plate 114, the resulting frictional contact slows or stops or otherwise prevents rotation of the wheel 104. In various embodiments, and as described below with reference to FIGS. 2A and 2B, the plurality of rotor disks 116 and the plurality of stator disks 118 may be fabricated from fiber reinforced composite materials, such as, for example, carbon fiber-carbon matrix (C/C) composite materials, that enable the brake disks to withstand and dissipate the heat generated during and following a braking action.

Figure 2A:
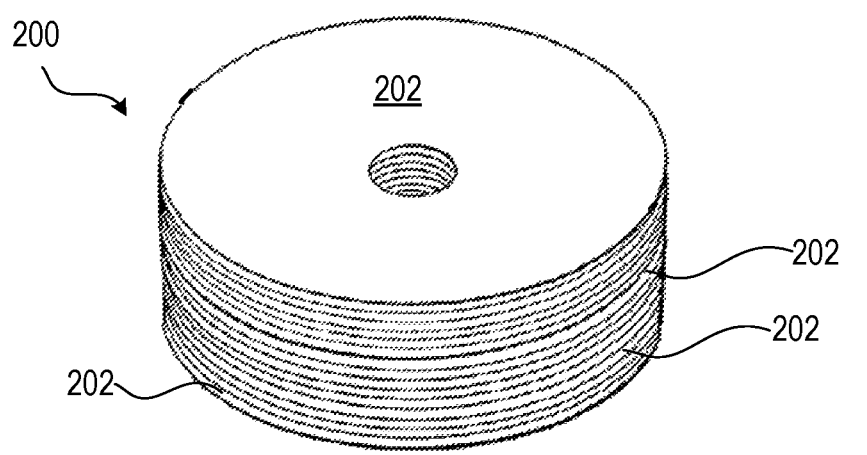
FIGS. 2A and 2B illustrate formation of a fibrous preform, in accordance with various embodiments.

Referring now to FIG. 2A, a fibrous preform 200 is illustrated, in accordance with various embodiments. The fibrous preform 200 may be employed to form one or more of the brake or heat sink components described above with reference to FIG. 1B (e.g., one or more of stator disks 118 or the rotor disks 116). The fibrous preform 200 may comprise a porous structure comprised of a plurality of stacked textile layers 202. A porous structure may comprise any structure derived from a fibrous material such as carbon fibers or the like. In various embodiments, the carbon fibers may be derived from polyacrylonitrile (PAN), rayon (synthetic fiber derived from cellulose), oxidized polyacrylonitrile fiber (OPF), or the like. The starting fiber may be pre-oxidized PAN or fully carbonized commercial carbon fiber. Fibrous preform 200 may be prepared by needling one or more textile layers 202. Needling the textile layers 202 tends to push fibers from one layer 202 to the next layer 202, thereby forming z-fibers that extend perpendicularly across the layers. Needling pulls fibers from the in-plane direction and forces them into the z-fiber direction. After needling, fibrous preform 200 may comprise fibers extending in three different directions (i.e., in the x-direction, the y-direction, and the z-direction).

Fibrous preform 200 may be fabricated using a net shape preforming technology or may be cut from a needled board. In various embodiments, fibrous preform 200 may be a 2D lay-up of woven, braided or knitted fabric. The fibrous material may be in the form of chopped carbon fibers molded to form a preform. Prior to the densification process, the fibrous material may be formed into a preform having any desired shape or form. For example, the fibrous preform may be in the form of a disk having any shape such as, for example, a polygon, a cylinder, a triangle, annular, square, rectangle, pentagon, hexagon, octagon, or the like. In addition, the fibrous preform may have an irregular form.

Figure 2B:
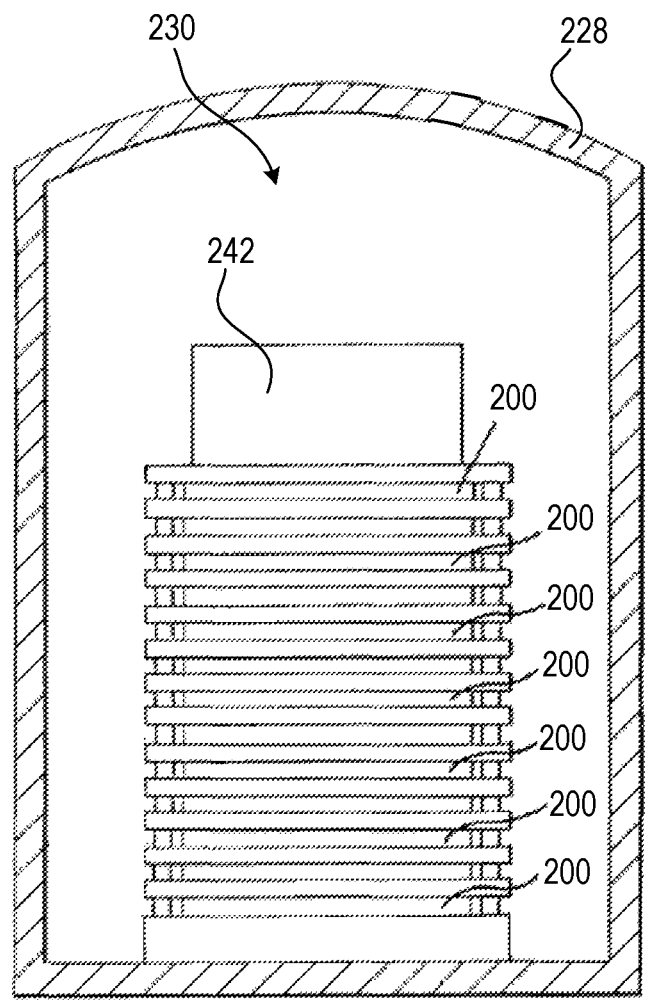

As shown in FIG. 2B, one or more of the fibrous preforms 200 may be placed in a furnace 228 for carbonization. The carbonization process may be employed to convert the fibers of the fibrous preforms 200 into carbon fibers, as used herein only "carbon fibers" means carbon fibers comprised of at least 90% carbon. The carbonization process is distinguished from the densification process described below in that the densification process involves infiltrating the pores of the fibrous preform 200 and depositing a carbon matrix within and around the carbon fibers of the fibrous preform, and the carbonization process refers to the process of converting the fibers of the fibrous preform 200 into carbon fibers. Carbonizing the oxidized carbon fiber precursor by heating the oxidized carbon fiber precursor at 2500° F. (1400° C.)-5072° F. (2800° C.) via a carbonization/graphitization process, as described herein, to form a carbon fiber preform.

In various embodiments, compressive pressure may be applied to fibrous preforms 200 during the carbonization process to increase the fiber volume of carbonized fibrous preforms 200. The compressive pressure may be applied by placing a weight 242 over fibrous preforms 200, or by applying a compressive load to the fibrous preform by other suitable means. The compressive pressure may be applied along the direction of the z-fibers. Applying compressive pressure to fibrous preforms 200 during the carbonization process tends to increase the after-carbonization fiber volume ratio of fibrous preforms 200. As used herein, "fiber volume ratio" means the ratio of the volume of the fibers of the fibrous preform to the total volume of the fibrous preform. For example, a fiber volume ratio of 25% means the volume of the fibers in the fibrous preform is 25% of the total volume of fibrous preform. In various embodiments, after carbonization, fibrous preform 200 comprises a fiber volume of 25% or greater. In various embodiments, after carbonization, fibrous preform 200 comprises a fiber volume of between 23% and 50%. In various embodiments, after carbonization, fibrous preform 200 comprises a fiber volume of between 25% and 40%.

After carbonization, fibrous preform 200 undergoes a chemical vapor infiltration (CVI) with carbon to form a C/C component—e.g., an annular shaped rotor disk or stator disk—having carbon fibers and a carbon matrix. In various embodiments, the CVI process is repeated until a desired density is achieved. In various embodiments, one or more heating steps may be performed during densification. After densification (i.e., after CVI of pyrolytic carbon), the densified preform may comprise greater than 8% open porosity, or between 8% and 35% open porosity, or between 8% and 25% open porosity, or between 8% and 15% open porosity. In various embodiments, open porosity may facilitate moisture sensitive and increased wear of the C/C component. CVI/CVD densification may be conducted in a vacuum or partial vacuum (e.g., at pressures of 1-15 torr) or in an inert atmosphere at a temperature in the range from about 900° C. to about 1100° C. (1,652° F. to about 1,832° F.), and in various embodiments in the range of up to about 1,000° C. (1,832° F.) (wherein the term about in this context only means+/−100° C.) for a period of time in the range from about 150 hours to about 550 hours, and in various embodiments, in the range from about 300 hours to about 500 hours (wherein the term about in this context only means+/−24 hours).

Figure 3A:
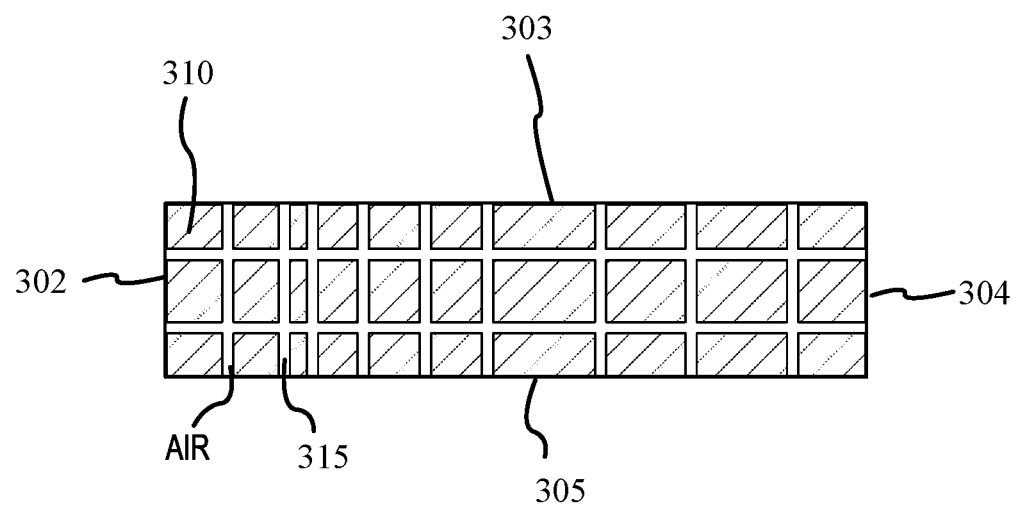
FIG. 3A illustrated a densified preform, in accordance with various embodiments.

Referring now to FIG. 3A, a cross-sectional view of a densified preform 310, in accordance with various embodiments, is illustrated. As a result of the densification process, open porosity, such as apertures 315, may form in the densified preform 310. In various embodiments, apertures may allow moisture to reach the wear surface of the C/C part which may have a negative influence on the coefficient of friction of the C/C part. In various embodiments, open porosity may allow oxidation protection systems (OPS) chemicals to reach the wear surface of the C/C part which may have a negative influence on the coefficient of friction of the C/C part. In various embodiments, open porosity may lead to increased oxidation rate of the C/C part. In various embodiments, open porosity may lead to decreased friction performance of the C/C part. In various embodiments, open porosity may lead to decreased mechanical strengths of the C/C part. In various embodiments, open porosity may be infiltrated by air. In various embodiments, open porosity may provide opportunity for moisture absorption and transfer of phosphate-based oxidation protection systems to the wear surfaces which may result in a reduction in friction performance. In various embodiments, apertures 315 may be disposed in densified preform 310 as illustrated in FIG. 3A.

Figure 3B:
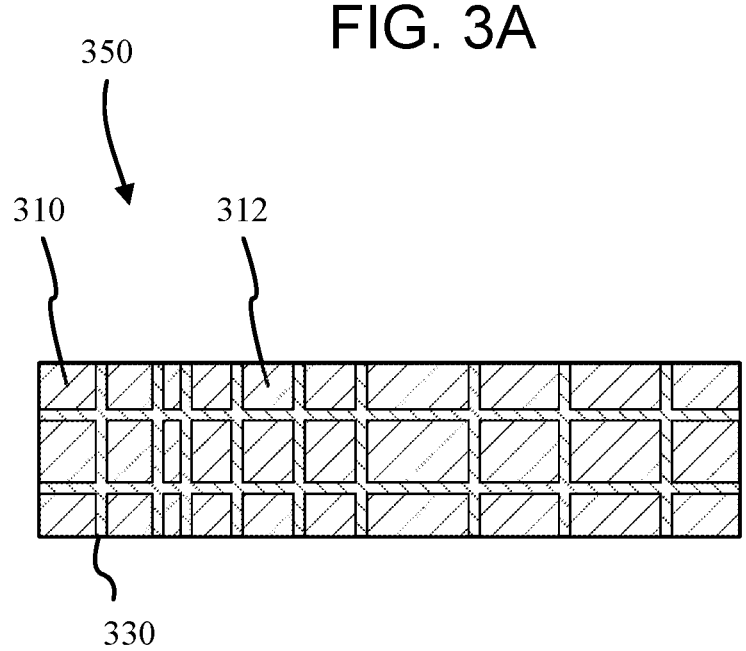
FIG. 3B illustrates a pitch infiltrated densified preform, in accordance with various embodiments.

Following the densification process, the densified preform 310 may undergo a pitch infiltration process. With further reference to FIG. 3B, the pitch infiltration process may allow pitch 330 to at least partially fill the open porosity of the densified preform 310, such as apertures 315, in densified preform 310. Pitch 330 may be a resin, a tar, or any other pitch known in the art. In various embodiments, pitch 330 is mesophase pitch, such as coal-based mesophase pitch, petroleum-based mesophase pitch. The pitch may be heated up and made into an anisotropic network structure and guided by a force form a gas source, such as nitrogen or argon, and a vacuum. In this regard, an orientation of the pitch 330 may be managed, as well as a crystal size of the pitch 330. In particular, the pitch 330 may be heated and guided through the open porosity of densified preform 310 while in an anisotropic network structure. Then after a desired orientation and size of the pitch 330 is achieved, the pitch 330 may be cooled down to room temperature rapidly, causing the pitch 330 to solidify in the open porosity form FIG. 3A. In various embodiments, pitch 330 may be a different material than the fibrous preform 200 (from FIGS. 2A-2B). For example, the fibrous preform 200 may comprise polyacrylonitrile (PAN), rayon (synthetic fiber derived from cellulose), oxidized polyacrylonitrile fiber (OPF), or the like. In various embodiments, by filling the open porosity with pitch, the resultant C/C component may have increased wear life, enhanced oxidation protection, and/or reduce brake moisture sensitivity. In this regard, a direction and crystal size of the pitch 330 may be managed and/or a migration pathway may be prevented from forming in the resultant C/C part.

In various embodiments, after the pitch infiltration, the pitch may be stabilized. Then, the densified preform and the pitch may undergo a final heat treatment (FHT) resulting in a C/C part 350. The C/C part 350 may comprise between 15% and 35% by weight carbon fiber (e.g., carbonized polyacrylonitrile (PAN), rayon (synthetic fiber derived from cellulose), oxidized polyacrylonitrile fiber (OPF), or the like), between 3% and 35%, or between 8% and 25%, or between 12% and 22% pitch, and a remainder carbon matrix from the CVI/CVD process. n various embodiments, the C/C part 350 may comprise an open porosity less than 5%. For example, the open porosity may be between 1% and 5%, or between 2% and 5%, or between 3% and 5%. In various embodiments, by adding a limited amount of pitch to fill a portion of open porosity in a C/C part 350 and/or reducing the open porosity below 5%, a C/C part may experience increase wear properties and reduced oxidation.

Referring back to FIG. 3A, the densified preform 310 may comprise an outer diameter surface 302, an inner diameter surface 304, a first axial surface 303 and a second axial surface 305. During a pitch infiltration process, a pitch in a solid form may be disposed on at least one of the outer diameter surface 302, the inner diameter surface 304, the first axial surface 303 and the second axial surface 305. The pitch may be heated until it reaches an anisotropic network structure. Once in the anisotropic network structure, the pitch may be guided by a force from a gas source having a less reactive gas, such as noble gases like nitrogen or argon, in a radial direction when the pitch is disposed on the outer diameter surface 302 or in an axial direction, when the pitch is disposed on the first axial surface 303 or the second axial surface 305. In this regard, an orientation of carbon in a C/C component may be managed after densification by adding additional carbon in a desired direction based on an open porosity in the desired direction.

Figure 4:
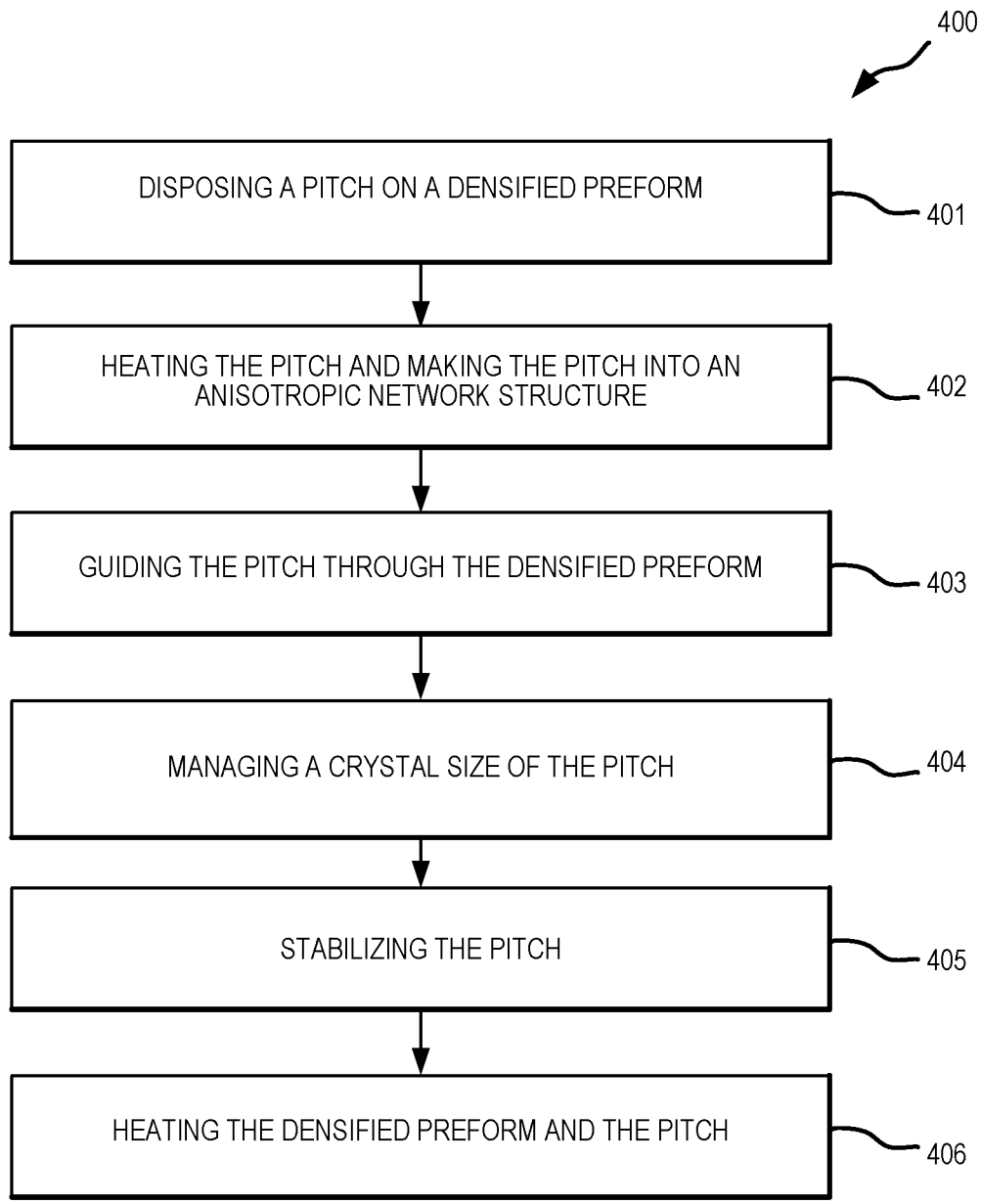
FIG. 4 illustrates a method of infiltrating pitch in a densified preform, in accordance with various embodiments.

Referring not to FIG. 4, a method 400 of pitch infiltration process for a densified carbon preform is illustrated, in accordance with various embodiments. The method 400 may comprise disposing a pitch on a densified preform surface (step 401). The pitch may be at room temperature and in a solid state. The densified preform surface may be an outer diameter surface of the preform (e.g., outer diameter surface 302 from FIG. 3A), an inner diameter surface of the preform (e.g., inner diameter surface 304), or an axial surface (e.g., first axial surface 303 or second axial surface 305 from FIG. 3A). The method may further comprise heating the pitch and making the pitch into a anisotropic network structure (step 402). The pitch may be heated to a temperature based on its softening point. In various embodiments, the pitch may be heated between 200° F. (93° C.) and 700° F. (371° C.). In the anisotropic network structure, the pitch may have a desirable viscosity for guiding the pitch through the densified preform in a predetermined direction (e.g., axial, radial, or the like).

The method may further comprise guiding the pitch through the densified preform (step 403). In various embodiments, the pitch may be guided by a force from a gas source, such as such as nitrogen or argon, and a vacuum. For example, if the pitch is disposed on an axial surface, the gas source may apply a force on the pitch in the anisotropic network structure in the axial direction. In this regard, the pitch may slowly translate in the axial direction through various pores of the densified preform. In various embodiments, by applying a force in a desired guiding direction, such as an axial direction or a radial direction, an orientation of the pitch may be managed. A desired orientation may be determined based on an orientation of carbon fibers and the carbon matrix from densification. For example, a guiding direction (i.e., axial or radial) may be determined based on fiber orientation from densification of the carbon preform.

The method 400 may further comprise managing a crystal size of the pitch (step 404). A crystal size of the pitch may be monitored by any method known in the art, such as a sensor, or the like. Once the crystal size reaches a desired size, the pitch may be brought into a solid state (i.e., brought back to room temperature to return the pitch to liquid form).

The method 400 may further comprise stabilizing the pitch (step 405). To prevent expulsion of the pitch in the final heat treatment stage, the pitch may be stabilized by crosslinking the pitch with oxygen and exposing the pitch and the densified preform to at least one of air and nitrogen at a fixed temperature between 150° F. (66° C.) and 700° F. (220° C.). By stabilizing the pitch, the pitch may remain in solid form upon the final heat treatment process.

The method 400 may further comprise heating the densified preform and the pitch at a final heat treat (FHT) process (step 406). FHT may be conducted in a vacuum or partial vacuum (e.g., at pressures of 1-15 torr) or in an inert atmosphere at a temperature in the range from about 1200° C. to about 2600° C. (2,192° F. to about 4,712° F.), and in various embodiments in the range from about 1400° C. to about 2200° C. (2,552° F. to about 3,992° F.) (wherein the term about in this context only means+/−100° C.) for a period of time in the range from about 4 hours to about 14 hours, and in various embodiments, in the range from about 8 hours to about 12 hours (wherein the term about in this context only means+/−2 hours). The FHT process may decrease the hardness of the C/C part (e.g., the densified preform and the pitch). In various embodiments, the FHT process may increase the coefficient of friction of the C/C part.

In various embodiments, the pitch may be managed in a desired direction in the composite, which may allow management of thermal conductivity between the X-Y plane and Z axis in the composite. In various embodiments, a thermal conductivity ratio between the X-Y plane to Z axis is between 1.25:1 to 3.7:1, or between 1:1.75 to 3.5:1, or between 2:1 to 3:1. In various embodiments, the methods disclosed herein may allow management of the crystal size of the pitch early in the process, thus manufacturing may be achieved without high temperature composite heat treatment to achieve the crystal size as designed. In various embodiments, the methods disclosed herein provide a way to quickly stabilize the pitch located on the surface or outside of the composite by air oxidative stabilization and/or stabilize the pitch inside of the composite by N2 thermal stabilization. In various embodiments, the method disclosed herein are able to cover the active sites located in fiber/matrix interface and open pores in the composite, thus controlling composite/brake moisture sensitivity. In various embodiments, the methods disclosed herein may fill the open pores by using pitch to block an oxidation protection system (OPS) migration pathway, thus controlling composite and/or brake moisture sensitivity.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas but not necessarily to denote the same or different materials. In some cases, reference coordinates may be specific to each figure.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of pitch infiltration, the method comprising:
    infiltrating a carbon fiber preform with carbon using chemical vapor infiltration or deposition (CVI/CVD) processing to increase a density of the carbon fiber preform to form a densified preform having an open porosity between 8% and 15%;
    disposing a pitch on a densified preform surface of the densified preform, wherein the pitch is a mesophase pitch;
    heating the pitch and making the pitch into an anisotropic network structure;
    guiding the pitch through the densified preform in a predetermined direction;
    managing a crystal size of the pitch;
    aligning the pitch in a predetermined orientation;
    stabilizing the pitch in the densified preform to form a composite with a pitch-based carbon; and
    carbonizing the composite and further managing the crystal size of the pitch-based carbon in the composite to form a carbon/carbon brake disk having a second open porosity of less than 5%.

2. The method of claim 1, wherein heating the pitch includes heating the pitch between 200° F. (93° C.) and 700° F. (371° C.).

3. The method of claim 1, further comprising at least partially filling an open pore of the densified preform with the pitch for blocking an oxidation protection system (OPS) migration pathway and controlling at least one of a composite moisture sensitivity and a brake moisture sensitivity.

4. The method of claim 3, wherein managing the crystal size further comprises monitoring the crystal size and reducing a composite heat treatment temperature in response to the crystal size reaching a predetermined crystal size and managing a thermal conductivity ratio between an X-Y plane and a Z axis of the densified preform as being between 1.25:1 to 3.7:1.

5. The method of claim 1, wherein the densified preform surface is at least one of an outer diameter surface, an inner diameter surface, and an axial surface to cover active sites located at fiber and matrix interfaces.

6. The method of claim 1, wherein stabilizing the pitch further comprises exposing the pitch and the densified preform to at least one of air and nitrogen at a fixed temperature between 150° F. (66° C.) and 700° F. (220° C.) for at least one of oxidative stabilization and thermal stabilization.

7. The method of claim 1, further comprising heating the densified preform and the pitch after stabilizing the pitch by exposing the pitch and the densified preform to at least one of air and nitrogen at a fixed temperature between 150° F. (66° C.) and 700° F. (220° C.).

8. A method of manufacturing a carbon/carbon brake disk comprising:
    forming a fibrous network from an oxidized carbon fiber precursor;
    carbonizing the oxidized carbon fiber precursor by heating the oxidized carbon fiber precursor at 1400-2800° C. to form a carbon fiber preform;
    infiltrating the carbon fiber preform with carbon using chemical vapor infiltration or deposition (CVI/CVD) processing to increase a density of the carbon fiber preform to form a densified preform having a first open porosity between 8% and 15%;
    infiltrating the densified preform with pitch by heating the pitch and making the pitch into an anisotropic network structure and guiding the pitch through an open porosity of the densified preform in a predetermined direction;
    managing a crystal size of the pitch;
    stabilizing the pitch to form a stabilized pitch; and
    carbonizing the densified preform with the stabilized pitch to form the carbon/carbon brake disk having a second open porosity of less than 5%.

9. The method of claim 8, further comprising aligning the pitch in a predetermined orientation within the open porosity.

10. The method of claim 8, further comprising at least partially filling open pores with the pitch for blocking an oxidation protection system (OPS) migration pathway.

11. The method of claim 10, wherein managing the crystal size further comprises monitoring the crystal size and reducing a temperature in response to the crystal size reaching a predetermined crystal size.

12. The method of claim 8, further comprising at least partially filling the open porosity with the pitch for blocking an oxidation protection system (OPS) migration pathway.

13. The method of claim 8, wherein stabilizing the pitch further comprises exposing the pitch and the densified preform to at least one of air and nitrogen at a fixed temperature between 150° F. (66° C.) and 700° F. (220° C.) for at least one of oxidative stabilization and thermal stabilization.

14. The method of claim 8, wherein heating the densified preform and the pitch further comprises exposing the pitch and the densified preform to at least one of air and nitrogen at a fixed temperature between 150° F. (66° C.) and 700° F. (371° C.).

* * * * *